United States Patent [19]
Oshima et al.
[11] Patent Number: 4,474,859
[45] Date of Patent: Oct. 2, 1984

[54] THERMAL DYE-TRANSFER TYPE RECORDING SHEET

[75] Inventors: Hiroyo Oshima; Yutaka Kojima; Yukio Kobayashi; Kouichi Nagai, all of Tokyo, Japan

[73] Assignee: Jujo Paper Co., Ltd., Tokyo, Japan

[21] Appl. No.: 346,019

[22] Filed: Feb. 5, 1982

[51] Int. Cl.[3] .......................... B32B 27/10; G03F 7/00

[52] U.S. Cl. .................................... 428/481; 428/206; 428/207; 428/211; 428/452; 428/331; 428/328; 428/330; 428/913; 428/483

[58] Field of Search ...................... 428/481, 488.1, 913, 428/207, 211, 206, 349; 8/470, 471

[56] References Cited

U.S. PATENT DOCUMENTS 3,825,561 7/1974 Akamatsu et al. .................. 260/335
4,132,833 1/1979 Sandhu ................................ 428/481
4,138,522 2/1979 Ishizuka et al. ................ 428/481 X

OTHER PUBLICATIONS

Japanese Patent Application Laid-Open, Specification No. 15446/76, 1976, pp. 277-280.

*Primary Examiner*—Patricia C. Ives
*Attorney, Agent, or Firm*—Koda and Androlia

[57] ABSTRACT

Thermal dye-transfer type recording sheet, having a coating layer which is placed on a base sheet, is contacted with a coloring material layer being solid or semisolid state at room temperature and on which a coloring material is transferred selectively by heating, wherein said coating layer comprises at least mixture of saturated polyester and polyvinyl pyrrolidone in a particular ratio. The sheet provides a very clear record with superior light fastness.

7 Claims, No Drawings

THERMAL DYE-TRANSFER TYPE RECORDING SHEET

BACKGROUND OF THE INVENTION

1. Field of the Invention

The present invention relates to a thermal dye-transfer type recording sheet, and more particularly to a recording sheet for use in the thermal dye-transfer type recording method, in which a substrate coated with a coloring material is used, the coloring material layer is brought into contact with a recording sheet and the coloring material is transferred to the recording sheet by heating by a thermal head or the like.

2. Prior Art

In the thermal recording method there is widely adopted a method in which a heat-sensitive recording paper having formed thereon a recording layer to be colored under heating by a physical or chemical change is brought into contact with a thermal head, whereby a record of a desirable color is obtained on the heat-sensitive recording paper. The heat-sensitive recording method, however, is defective in that coloration contamination is readily caused in a heat-sensitive recording paper because of pressure or heat unavoidably applied to the heat-sensitive recording paper during storage or at the time of handling and that the manufacturing cost of such heat-sensitive recording paper is high.

As means for overcoming the above defects of the conventional heat-sensitive recording method, there has been proposed a method as disclosed in the Japanese Patent Application Laid-Open Specification No. 15446/76. It discloses that a substrate, such as paper or resin film, is coated with a coloring material which is solid or semi-solid at room temperatures, the coloring material coated on the substrate is brought into contact with a recording sheet and the coloring material on the substrate is selectively transferred to the recording sheet by heating by a thermal head to perform recording. The reason why transfer of the coloring material coated on the substrate to the recording sheet is effected is that the coloring material or a binder containing the coloring material is molten, evaporated or sublimated by heating and adhesion or absorption of the coloring material to the recording sheet is thus caused. The coloring material customarily used in this recording method is a dispersion of a dye or pigment in a binder such as a wax. Even if this dispersion type coloring material is brought into contact with a recording sheet in normal conditions, transfer of the coloring material does not occur. Transfer of the coloring material takes place first when assembly of the coloring material and the recording sheet is heated at, for example, 60 to 300° C. or about 500° C. in some cases. Sublimable dyes having a sublimation temperature of 60 to 300° C., for example, disperse dyes of the nitro, azo, quinoline and anthraquinone types are preferably used as the coloring material. Accordingly, this recording method is characterized in that plain paper can be used as the recording sheet.

However, when plain paper is used as the recording shet in the above recording method, the color density of the obtained record is low and fading of the color with the lapse of time is conspicuous. In other words, a recording sheet suitable for use in this recording method has not been developed.

SUMMARY OF THE INVENTION

An object of this invention is to provide a thermal transfer-type recording sheet which has a very clear record with superior light fastness.

The above object is obtained by using in the coating layer of the present invention at least a mixture of 18 to 24% by weight of saturated polyester and 6 to 12% by weight of polyvinyl pyrrolidone.

DETAILED DESCRIPTION OF THE INVENTION

An example of a saturated polyester which can be used in the present invention is polyethylene terephthalate (PET, melting point=260° C.) obtained by polycondensation of terephthalic acid and ethylene glycol. In addition, polybutylene terephthalate (PBT, melting point=224° C.), poly-1, 4-cyclo-hexanedimethylene terephthalate (PCHT, melting point=290° C.) can be used. Usually, these phthalic acid type polyesters are insoluble in most solvents. However, solvent-soluble or water, dispersive granular products of these polyesters have recently been developed as saturated polyester type binders. In the present invention, a solution of such saturated polyester in solvent may be used, but use of a water dispersible saturated polyester is preferred because handling of the polyester is easier.

Polyvinyl pyrrolidone is a polymer having a very good water solubility and being capable of forming a transparent film, and it is known that polyvinyl pyrrolidone can be applied to manufacture medicines, cosmetics, adhesives and fiber finishing agents.

The thermal dye-transfer type recording sheet of the present invention is prepared by coating on a support with a coating color containing an aqueous dispersion of said saturated polyester or a solution of said saturated polyester in solvent with an aqueous solution of polyvinyl pyrrolidone and if necessary with an ordinary pigment such as calcium carbonate, in a coating weight of 7 to 15 g/m. The thermal dye-transfer type recording sheet is obtained by coating of a mixture of the saturated polyester and polyvinyl pyrrolidone, and the resulting coated paper may be used under such recording conditions that the heating area is very small, as in the case of an electrocardiogram meter. However, when the heating area is large as in the case of a thermal plate, adhesion is caused between the recording sheet and a coloring material-coated substrate just after thermal recording and separation between the two becomes difficult. Accordingly, in order to obtain a general-purpose recording sheet, it is preferred that pigments are added to the coating color composition for facilitating separation of the recording sheet from the substrate. As the pigment, there may appropriately be chosen and used ordinary pigments such as natural ground calcium carbonate, precipitated carbonate, talc, kaolin, natural or synthetic silicate, amorphous silica, aluminum hydroxide, zinc oxide and titanium dioxide. Among these pigments, calcium carbonate is most preferred because it provides a good optical color density and a high separation effect. It is preferred that the pigment be added in an amount of 50 to 900 parts by weight per 100 parts by weight of the mixture of the saturated polyester and polyvinyl pyrrolidone. In the present invention, in order to attain special purposes, the above-mentioned binder may be used in combination with other binders customarily used for processing of paper, such as modified starch, hydroxyethyl cellulose, methyl cellulose, a styrene-butadiene copolymer latex (SBR latex), an acrylic polymer latex, polyvinyl alcohol, a derivative thereof, protein, gelatin, casein, and guar gum.

When the saturated polyester is used in combination with polyvinyl pyrrolidone, if the polyvinyl pyrrolidone is incorporated in an amount of 6 to 12% by weight with 18 to 24% by weight of the saturated polyester as described in the following Example, there can be obtained a recording sheet which is most excellent in optical color density and color fastness.

As the support of the thermal recordng sheet of the present invention, there can be used plain papers such as fine papers, namely papers made from a bleached chemical pulp, such as NBKP, NBSP, LBKP or LBSP, to which are added according to need a mechanical pulp such as GP or TMP, a semi-mechanical pulp such as CGP, a dry strength additive such as starch, polyacrylamide resin or its derivative, melamineformaldehyde resin or a urea-formaldehyde resin, a sizing agent such as rosin, a synthetic polymer or an alkylketene dimer, a precipitant such as aluminium sulfate, an inorganic filler such as talc, clay, natural ground calcium carbonate or precipitated calcium carbonate, aluminum hydroxide, a natural or synthetic silicate or titanium dioxide and an organic filler such as a powdery urea-formaldehye resin, and papers obtained by externally adding oxidized starch or other dry strength additives to the foregoing papers. However, it must be noted that the composition of the paper used as the support is not particularly critical. Furthermore, in some application fields, a resin film can be used as the support of the recording sheet of the present invention.

The present invention will now be described in detail with reference to the following Example that by no means limit the scope of the present invention.

EXAMPLE

A 40% aqueous dispersion of a saturated polyester ("Vilonal MD-1200" manufactured and supplied by Toyobo Co., Ltd.) was mixed with a 40% aqueous solution of polyvinyl pyrrolidone at a mixing ratio shown in the Table and a slurry of natural ground calcium carbonate ("Super 1500" manufactured and supplied by Maruo Calcium Co., Ltd.) was added to the mixed binder to obtain coating colors. On the other hand, two coating colors were prepared by mixing 30 parts by weight (as solids) of a 40% aqueous dispersion of a saturated polyester ("Vilonal MD-1200" manufactured and supplied by Toyobo Co., Ltd.), a 40% aqueous solution of polyvinyl pyrrolidone independently with 70 parts by weight (as solids) of a slurry of natural ground calcium carbonate ("Super 1500" manufactured and supplied by Maruo Calcium Co., Ltd.). These coating colors were coated in a coating weight of 10 to 14 g/m$^2$ on a fine paper having Stockigt sizing degree of 12 seconds, a basis weight of 66 g/m$^2$ and a thickness of 97 $\mu$m to obtain thermal recording sheets Nos. 10, 14, 18, 19, 20 and 21.

Separately, sublimable thermal transfer inks of blue, yellow and red were prepared by kneading 10 parts by weight of each of the following three sublimable disperse dyes; namely Disperse Blue 24 (marketed under the tradename "Duranol Blue 2G"), Disperse Yellow 42 (marketed under the tradename of "Resolin Yellow GRL") and Disperse Rde 1 (marketed under the tradename of "Celliton Scarlet B"), independently with 3 parts by weight of polyvinyl butyral and 45 parts by weight of isopropyl alcohol by means of a three-roll mixing ill. A fine paper having a basis weight of 30 g/m$^2$ was solidly gravure printed with these inks to obtain a transfer substrate. The printed surface of the transfer substrate was brought into contact with the coated surface of the above-mentioned thermal dye-transfer type recording sheet and the assembly was pressed for 5 seconds to a thermal plate of 3 cm×3 cm maintained at 300° C. so that the back face of the transfer substrate was faced to the thermal plate, whereby thermal transfer to the thermal recording sheet was performed. The reflective optical densities the so-prepared transfer substrate. The reflective optical densities of the blue, yellow and red recorder surfaces of the thermal transfer sheets were measureed by a Macbeth densitometer after 24 hours had passed from the time of thermal transfer. Furthermore, in order to examine the change of the record with the lapse of time, the obtained record was exposed to carbon arc beams for 10 hours by using a fade meter and then the optical color densities of the exposed record where similarly measured. This exposure corresponds to about 20 days of outdoor exposure in and around Tokyo. Incidentally, the reflective optical densities were measured by using a visual filter (Wratten No. 106) for the blue color, a blue filter (Wratten No. 47) for the yellow color and a green filter (Wratten No. 58) for the red color. The obtained results are shown in the Table.

TABLE

Results Obtained in Example

| | Thermal Dye-Transfer Type Recording Paper | | Reflective Optical Densities | | | |
|---|---|---|---|---|---|---|
| No. | Binders (% by weight) | Pigment (% by weight) | Measuring Time | Blue | Yellow | Red |
| 10** | polyester (30) | natural ground calcium carbonate (70) | after 24 hrs. standing | 1.19 | 0.70 | 1.18 |
| | | | after exposure by fade meter | 1.19 | 0.69 | 1.18 |
| 18* | polyester (24) & polyvinyl pyrrolidone (6) | natural ground calcium carbonate (70) | after 24 hrs. standing | 1.20 | 0.70 | 1.20 |
| | | | after exposure by fade meter | 1.20 | 0.69 | 1.20 |
| 19* | polyester (18) & polyvinyl pyrrolidone (12) | natural ground calcium carbonate (70) | after 24 hrs. standing | 1.21 | 0.69 | 1.20 |
| | | | after exposure by fade meter | 1.20 | 0.69 | 1.19 |
| 20** | polyester (12) & polyvinyl pyrrolidone (18) | natural ground calcium carbonate (70) | after 24 hrs. standing | 1.20 | 0.70 | 1.19 |
| | | | after exposure by fade meter | 1.19 | 0.68 | 1.15 |
| 21** | polyester (6) & | natural ground | after 24 hrs. | 1.21 | 0.70 | 1.20 |

TABLE-continued

| Results Obtained in Example | | | | | | |
|---|---|---|---|---|---|---|
| Thermal Dye-Transfer Type Recording Paper | | | Reflective Optical Densities | | | |
| No. | Binders (% by weight) | Pigment (% by weight) | Measuring Time | Blue | Yellow | Red |
| | polyvinyl pyrrolidone (24) | calcium carbonate (70) | standing | | | |
| | | | after exposure by fade meter | 1.18 | 0.66 | 1.12 |
| 14** | polyvinyl pyrrolidone (30) | natural ground calcium carbonate (70) | after 24 hrs. standing | 1.21 | 0.70 | 1.20 |
| | | | after exposure by fade meter | 1.17 | 0.64 | 1.07 |

Note:
*present invention
**reference example

As is apparent from the Table, in the case of the thermal dye transfer type recording sheets Nos. 18 and 19, the reflective optical densities after 24 hours of standing were especially high, and no substantial color fading was observed even after exposure by the fade meter. That is, with regard to reflective optical densities for blue color and the red color after 24 hours of standing, (reflective densities), sheets Nos. 14, 18, 19 and 21 are superior to the sheet No. 10. With regard to reflective optical densities for the blue color and the red color after exposure by the fade meter (light fastness), sheets Nos. 18 and 19 (of the present invention) are superior to the sheet No. 10, 14, 20 and 21 (of the reference examples).

Consequently the sheet Nos. 18 and 19 of the present invention (wherein 18 to 24% by weight of saturated polyester and 6 to 12% by weight of polyvinyl pyrrolidone is utilized) has superior reflective optical densities after 24 hours of standing (reflective density) and after exposure by the fade meter (light fastness) as compared with sheet Nos. 10, 14, 20 and 21 of the reference examples. As is described above, when 18 to 24% by weight of saturated polyester and 6 to 12% by weight of polyvinyl pyrrolidone is utilized as in the present invention, there can be obtained a thermal recording sheet of high quality which is especially excellent in both the reflection density and the sunlight fastness of the record.

We claim:

1. Thermal dye-transfer type recording sheet having a coating layer which is placed on a base sheet, said recording sheet is contacted with a coloring material layer being solid or semisolid at room temperature and on which a coloring material is transferred selectively by heating, wherein said coating layer comprises at least a mixture of 18 to 24% by weight of saturated polyester and 6 to 12% by weight of polyvinyl pyrrolidone.

2. Thermal dye-transfer type recording sheet according to claim 1, wherein said saturated polyester is at least one substance selected from the group consisting of polyethylene terephthalate, polybutylene terephthalate, poly-1, 4-cyclo-hexanedimethylene terephthalate, and polyethyleneisophthalate.

3. Thermal dye-transfer type recording sheet according to claim 1, wherein said coating layer includes a pigment.

4. Thermal dye-transfer type recording sheet according to claim 3, wherein said pigment is at least one substance selected from the group consisting of natural ground calcium carbonate, precipitated calcium carbonate, talc, kaolin, natural silicate, synthetic silicate, amorphous silica, aluminium hydroxide, zinc oxide and titanium dioxide.

5. Thermal dye-transfer type recording sheet according to claim 1, wherein said coating layer includes at least one binder selected from the group consisting of modified starch, hydroxyethyl cellulose, methyl cellulose, styrene-butadiene copolymer latex, acrylic polymer latex, polyvinyl alcohol, derivatives of polyvinyl alcohol, protein gelatin, casein, and guar gum.

6. Thermal dye-transfer type recording sheet according to claim 1, wherein said base sheet is a plain paper.

7. Thermal dye-transfer type recording sheet according to claim 1, wherein said base sheet is a resin flim.

* * * * *